(12) United States Patent
Patalay et al.

(10) Patent No.: US 10,345,155 B2
(45) Date of Patent: Jul. 9, 2019

(54) MODEL BASED LAMP BACKGROUND FILTRATION OF STRAY RADIATION FOR PYROMETRY

(71) Applicant: Applied Materials, Inc., Santa Clara, CA (US)

(72) Inventors: Kailash Kiran Patalay, Santa Clara, CA (US); Aaron Muir Hunter, Santa Cruz, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/665,545

(22) Filed: Aug. 1, 2017

(65) Prior Publication Data

US 2018/0045575 A1   Feb. 15, 2018

Related U.S. Application Data

(62) Division of application No. 14/257,665, filed on Apr. 21, 2014, now Pat. No. 9,739,666.

(60) Provisional application No. 61/818,158, filed on May 1, 2013.

(51) Int. Cl.

| G01K 15/00 | (2006.01) |
| G01K 1/00 | (2006.01) |
| G01K 13/00 | (2006.01) |
| G01J 5/10 | (2006.01) |
| H01L 21/67 | (2006.01) |
| G01J 5/00 | (2006.01) |

(52) U.S. Cl.
CPC .......... *G01J 5/10* (2013.01); *H01L 21/67115* (2013.01); *H01L 21/67248* (2013.01); *G01J 2005/0048* (2013.01)

(58) Field of Classification Search
USPC ...................... 374/1, 208, 141, 120
See application file for complete search history.

(56) References Cited

U.S. PATENT DOCUMENTS

| 5,255,286 | A | * | 10/1993 | Moslehi | ............... | G01J 5/0003 250/227.11 |
| 5,601,366 | A | | 2/1997 | Paranjpe | | |
| 2009/0027648 | A1 | * | 1/2009 | Van Der Wijst | ....... | G03B 27/58 355/72 |
| 2010/0232470 | A1 | | 9/2010 | Timans | | |
| 2012/0201267 | A1 | * | 8/2012 | Patalay | ................ | G01J 5/0007 374/1 |

* cited by examiner

*Primary Examiner* — Mirellys Jagan
(74) *Attorney, Agent, or Firm* — Patterson + Sheridan LLP

(57) ABSTRACT

The embodiments described herein generally relate to systems for noise compensation for proper temperature detection in thermal processing chambers and devices for achieving the same. In one embodiment, a system is disclosed herein. The system includes a processing chamber, a substrate, a pyrometer, and a controller. The processing chamber is configured to process a substrate. The substrate support is disposed in the processing chamber. The pyrometer is positioned to receive radiation emitted by a substrate or a component of the processing chamber and generating a pyrometer signal indicative of the received radiation. The controller is configured to subtract a time invariant noise component and a time variant noise component from the pyrometer signal during processing of a substrate.

24 Claims, 7 Drawing Sheets

MODEL BASED LAMP BACKGROUND FILTRATION OF STRAY RADIATION FOR PYROMETRY

CROSS-REFERENCE TO RELATED APPLICATIONS

This application is a divisional of U.S. Non-Provisional patent application Ser. No. 14/257,665, filed Apr. 21, 2014, which claims the benefit of U.S. Provisional Patent Application Ser. No. 61/818,158, filed May 1, 2013, both of which are incorporated herein by reference in their entireties.

BACKGROUND OF THE INVENTION

Field of the Invention

Embodiments disclosed herein generally relate to pyrometry in rapid thermal processing chambers.

Description of the Related Art

Rapid thermal processing (RTP) and epitaxial deposition (Epi) systems are employed in semiconductor chip fabrication to create, chemically alter or etch surface structures on semiconductor wafers. RTP and Epi typically depend upon an array of high-intensity incandescent lamps fit into a lamphead and directed at the substrate or wafer. The lamps are electrically powered and can be very quickly turned off and on and a substantial fraction of their radiation can be directed to the substrate. As a result, the wafer can be very quickly heated without substantially heating the chamber and can be nearly as quickly cooled once the power is removed from the lamps.

A number of infrared lamps are located in the lamphead. During processing, radiation from the lamps radiates through an upper window, light passageways and a lower window onto a rotating semiconductor substrate in the processing chamber. In this manner, the wafer is heated to a required processing temperature. The lamphead may include a number of light pipes to deliver highly collimated radiation from tungsten-halogen lamps to the processing chamber. The lamps are divided into multiple zones, which are located in a radially symmetrical manner. Each zone is separately powered by a lamp driver that is, in turn, controlled by a multi-input, multi-output controller. The lamps are connected to the lamp drivers through a large wiring collar and heavy-duty electrical cabling.

During a heating process, the heated substrate releases radiation which is received by one or more pyrometers. The radiation received is used to determine the temperature of the substrate. However, it is believed that other radiation sources, such as the lamps, produce noise which distorts the detected radiation at the pyrometer. This noise combines with the radiation from the substrate to create a combination photocurrent which represents the detection of both the heat and the noise at the pyrometer. One approach to address the problem is to mechanically or optically shield or block stray radiation to the pyrometers using shield rings or spectrally selective windows or lenses. However, mechanical shielding or blocking can be insufficient to prevent noise while allowing proper radiation to pass. Further, for some applications that require the pyrometer to be on the same side as the lamphead, such shielding approaches are not feasible.

Thus, there is a need in the art for correction of noise detected at a pyrometer during thermal processing.

SUMMARY OF THE INVENTION

The embodiments described herein generally relate to noise correction of radiation as detected by a pyrometer during thermal processing.

In one embodiment, a system is disclosed herein. The system includes a processing chamber, a substrate, a pyrometer, and a controller. The processing chamber is configured to process a substrate. The substrate support is disposed in the processing chamber. The pyrometer is positioned to receive radiation emitted by a substrate or a component of the processing chamber and generating a pyrometer signal indicative of the received radiation. The controller is configured to subtract a time invariant noise component and a time variant noise component from the pyrometer signal during processing of a substrate.

In another embodiment, a system is disclosed herein. The system includes a processing chamber, a substrate support, a pyrometer, and a controller. The processing chamber is configured to process a substrate. The substrate support is disposed in the processing chamber. The pyrometer is positioned to receive radiation emitted by a substrate or a component of the processing chamber and generating a pyrometer signal indicative of the received radiation. The controller generates an amount of noise generated by a lamp of the processing chamber. The controller performing the operation of averaging at least a portion of first order time-response values to create a steady state value for each of the first order time response values.

In another embodiment, a system is disclosed herein. The system includes a processing chamber, a substrate support, one or more pyrometers, and a controller. The processing chamber is configured to process a substrate. The substrate support is disposed in the processing chamber. Each pyrometer is positioned to receive radiation emitted by a substrate or a component of the processing chamber and generating a pyrometer signal indicative of the received radiation. The controller generates an amount of noise generated by a lamp of the processing chamber. The controller performing the operation of measuring lamp noise detected by a pyrometer in a process chamber at a temperature near ambient temperature, the process chamber comprising one or more pyrometers and one or more lamp zones, repeating the performance of the measurement using each of the one or more lamp zones and at each of the one or more pyrometers until each of the one or more pyrometers has been measured with relation to each of the one or more lamp zones, the lamp zones being measured individually, calculating a linear relation between the steady state values for each of the one or more lamp zones and each of the one or more pyrometers, subtracting the steady state values and the first order time-response values from a measured value detected by the one or more pyrometers to create an adjusted value, determining an actual temperature based on the adjusted value.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments disclosed herein generally relate to semiconductor processing and more specifically to reduction of the effect of noise as detected in an Epi or a RTP chamber. During a heating process, the pyrometers receive both radiation from the components of the chamber, including the substrate, and radiation from the lamps. Embodiments described herein incorporate the measured raw photocurrent signal and the first order transient response during heat up and cool down to separate lamp noise radiation from radiation received from the heated substrate. Collected data regarding steady state value and first order time-response value can be determined at a single point in time, and adjusted at points in time corresponding to the life cycle of the lamps or at other points in time as desired by the user. In this way, the temperature of the substrate and surrounding structures can be separated from noise produced by the lamps. The embodiments of the inventions disclosed herein are more clearly described with reference to the figures below.

Figure 1:
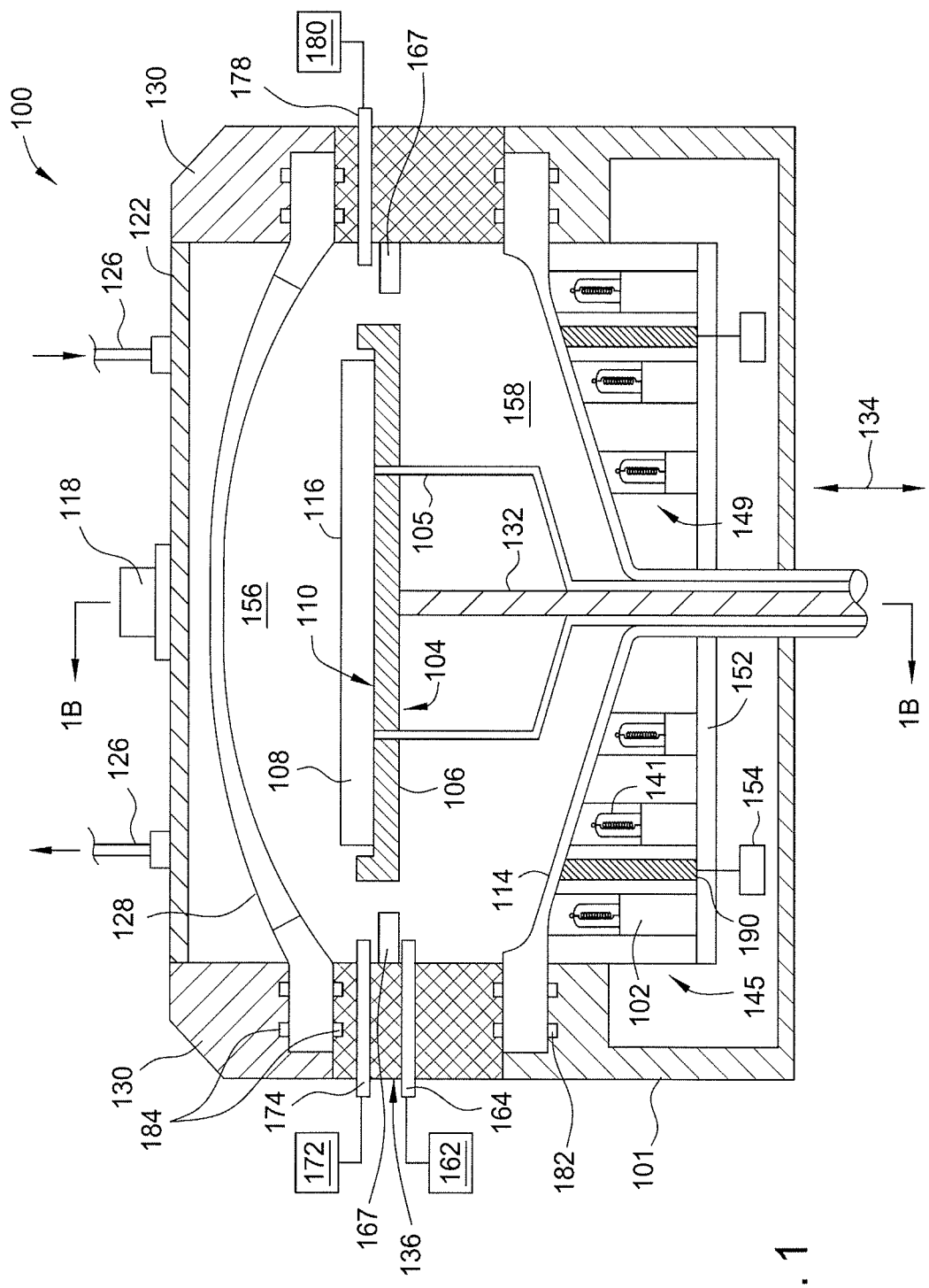
FIG. 1 illustrates a schematic sectional view of a backside heating process chamber according to one embodiment.

FIG. 1 illustrates a schematic sectional view of a backside heating process chamber 100 according to one embodiment. One example of the process chamber that may be adapted to benefit from the invention is an Epi process chamber, which can be mounted on a Centura or Producer platform, all available from Applied Materials, Inc., located in Santa Clara, Calif. It is contemplated that other processing chambers, including those from other manufacturers, may be adapted to practice the present invention.

The process chamber 100 may be used to process one or more substrates, including the deposition of a material on an upper surface of a substrate 108. The process chamber 100 generally includes an array of radiant heating lamps 102 for heating, among other components, a back side 104 of a substrate support 106 disposed within the process chamber 100. The substrate support 106 may be a disk-like substrate support 106, or may be a ring-like substrate support (not shown), which supports the substrate from the edge of the substrate or may be a pin-type support which supports the substrate from the bottom by minimal contact posts or pins.

The substrate support 106 is located within the process chamber 100 between an upper dome 128 and a lower dome 114. The upper dome 128 and the lower dome 114, along with a base ring 136 that is disposed between the upper dome 128 and lower dome 114, generally define an internal region of the process chamber 100. The substrate 108 (not to scale) can be brought into the process chamber 100 and positioned onto the substrate support 106 through a loading port (not shown), which is obscured by the substrate support 106.

The base ring 136 generally includes the loading port, a process gas inlet 174, and a gas outlet 178. The base ring 136 may have a generally oblong shape with the long side on the loading port and the short sides on the process gas inlet 174 and the gas outlet 178, respectively. The base ring 136 may include one or more coolant flow channels (not shown) disposed in proximity to O-rings 182, 184 for cooling of the base ring.

The substrate support 106 can divide the internal volume of the process chamber 100 into a process gas region 156 that is above the substrate, and a purge gas region 158 below the substrate support 106. The substrate support 106 is rotated during processing by a central shaft 132 to minimize the effect of thermal and process gas flow spatial anomalies within the process chamber 100 and thus facilitate uniform processing of the substrate 108. The substrate support 106 is supported by the central shaft 132, which moves the substrate 108 in an up and down direction 134 during loading and unloading, and in some instances, processing of the substrate 108. The substrate support 106 may be formed from silicon carbide or graphite coated with silicon carbide to absorb radiant energy from the lamps 102 and conduct the radiant energy to the substrate 108.

In general, the central window portion of the upper dome 128 and the bottom of the lower dome 114 are formed from an optically transparent material such as quartz. The thickness and the degree of curvature of the upper dome 128 may be configured to provide a flatter geometry for uniform flow uniformity in the process chamber.

A reflector 122 may be optionally placed outside the upper dome 128 to reflect infrared light that is radiating off the substrate 108 back onto the substrate 108. The reflector 122 may be secured to the upper dome 128 using a clamp ring 130. The reflector 122 can have one or more machined channels 126 connected to a cooling source (not shown) for cooling the reflector 122.

Process gas supplied from a process gas supply source 172 can be introduced into the process gas region 156 through a process gas inlet 174. The process gas can exit the process gas region 156 through a gas outlet 178 located on the opposite side of the process chamber 100 as the process gas inlet 174. Removal of the process gas through the gas outlet 178 may be facilitated by a vacuum pump 180 coupled thereto. Purge gas supplied from a purge gas source 162 can be introduced to the purge gas region 158 through a purge gas inlet 164 formed in the sidewall of the base ring 136. The purge gas can be exhausted out of the process chamber through the gas outlet 178 located on the opposite side of the process chamber 100 as the purge gas inlet 164.

One or more lamps, such as an array of lamps 102, can be disposed adjacent to and beneath the lower dome 114 in a specified manner around the central shaft 132 to independently control the temperature at various regions of the substrate 108 as the process gas passes over, thereby facilitating the deposition of a material onto the upper surface of the substrate 108. The lamps 102 may include a heat generating element, depicted here as a lamp bulb 141, and be configured to heat the substrate 108 to a temperature within a range of about 200 degrees Celsius to about 1600 degrees Celsius. In a further embodiment, the heat generating element can include non-incandescing solid radiators, such as an LED, or further radiation producing devices.

Each of the lamps 102 can be coupled to a power distribution board, such as printed circuit board (PCB) 152, through which power is supplied to each of the lamps 102. The lamps 102 are positioned within a lamphead 145 which may be cooled during or after processing by, for example, a cooling fluid introduced into channels 149 located between the lamps 102. The lamphead 145 conductively and radiatively cools the lower dome 104 due in part to the close proximity of the lamphead 145 to the lower dome 104. The lamphead 145 may also cool the lamp walls and walls of the reflectors (not shown) around the lamps. Alternatively, the lower dome 104 may be cooled by a convective approach. The positioning of the lamps 102 in the lamphead 145 and on the PCB 152 form lamp zones 202, which are described with reference to FIG. 2 below. Each lamp zone 202 is separately powered by a lamp driver that is, in turn, controlled by a controller (not shown), such as a multi-input, multi-output controller.

A circular shield 167 may be optionally disposed around the substrate support 106 and coupled to sidewall of the chamber body 101. The circular shield 167 prevents or minimizes leakage of heat/light noise from the lamps 102 to the device side 116 of the substrate 108 in addition to providing a pre-heat zone for the process gases. The circular shield 167 may be made from CVD SiC, sintered graphite coated with SiC, grown SiC, opaque quartz, coated quartz, or any similar, suitable material that is resistant to chemical breakdown by process and purging gases.

The temperature of the substrate 108 can be inferred from pyrometer measurements of the bottom of the substrate support 106 by back pyrometers 154. The back pyrometers 154 can be in optical connection with ports 190 formed in the lamphead 145. One or more pyrometers 154 can be used to detect radiation from the substrate and thereby determine the temperature of the substrate. In conjunction with or in lieu of the back pyrometers 154, one or more front side pyrometers, such as front pyrometer 118, can be used for temperature measurements on the substrate. The front pyrometer 118 can sense radiation from the hot substrate 108 with minimal background radiation from the lamps 102 directly reaching the optical pyrometer 118 due to the circular shield 167. Though the front pyrometer 118 and the back pyrometers 154 are depicted as one and two pyrometers respectively, it is understood that the number of pyrometers depicted are not intended to be limiting of possible embodiments. Any number of pyrometers (including no pyrometers) may be used on either the front side, the back side or combinations thereof. In one embodiment, the process chamber 100 has four back pyrometers 154 configured in optical connection with the substrate 108 or the substrate support 106.

Without intending to be bound by theory, it is believed that the lamps 102 can create noise in the pyrometer measurements as received by either front side optical pyrometer (e.g. front pyrometer 118) or back side optical pyrometers (e.g. back pyrometers 154). It is believed that radiation from the lamps 102 may reflect to some degree either back to the back pyrometers 154 or between contact points between the shield 167 and the substrate support 106. As such, either the front side pyrometer approach, the back side pyrometer approach or both may require corrections to be made for reflected radiation from the lamps 102 particularly at low substrate temperatures.

The PCB 152 and the pyrometers are in connection with the controller. The controller determines a noise value at a time point, such as every control cycle. The controller then uses the noise value to adjust a set point for the temperature controller.

Figure 2:
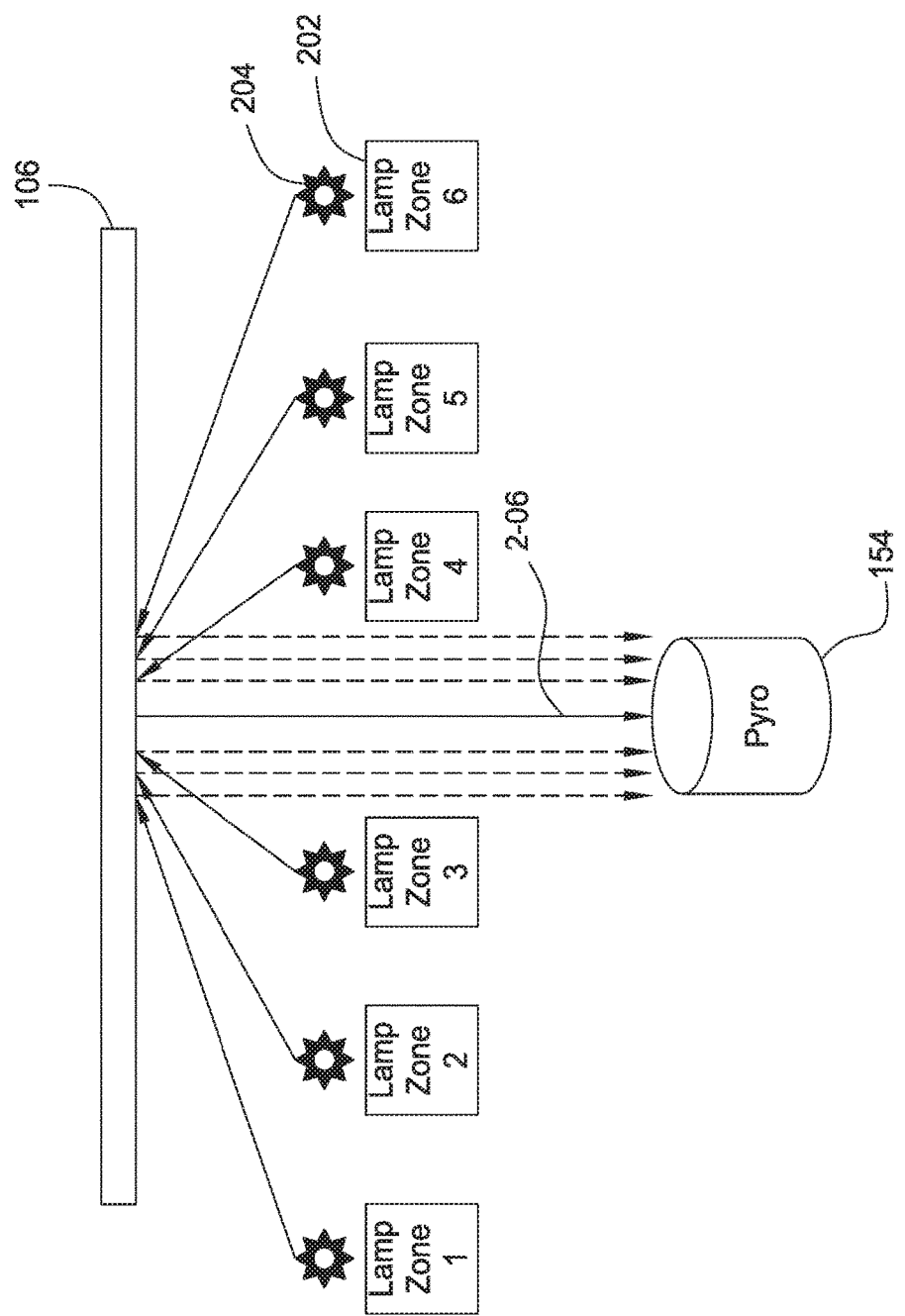
FIG. 2 is a schematic depiction of the model-based noise estimation concept according to one embodiment.

FIG. 2 is a schematic depiction of the model-based noise estimation concept according to one embodiment. Only components that assist in the explanation are included and it is understood that certain components which may be utilized in one or more embodiments are deleted for sake of clarity. Depicted here, a plurality of lamp zones 202 are configured to deliver radiant energy 204 to the substrate support 106. The radiant energy 204 is both received by the substrate support 106 and reflected by the substrate support 106. Though the radiant energy 204 is depicted as being delivered at an angle, a specific directionality or orientation is not necessary for the functioning of one or more embodiments. In one or more embodiments, the substrate 108 is exposed directly to the radiant energy 204 and thus will both receive and reflect the radiant energy in place of the substrate support 106.

The lamp zones 202 are clusters of one or more lamps 145 which can receive voltage as a group through the PCB 152. Thus, the lamp zones 202 can deliver radiant energy to the process chamber 100 as a group. In embodiments described herein, the process chamber can be configured with one or more lamp zones 202. In this embodiment, the process chamber 100 is depicted as having six lamp zones 202, though it is understood that more or fewer lamp zones 202 with various quantities of lamps can be used.

The radiant energy 204 which is received by the substrate support 106 is absorbed and converted to heat. The heat can both heat the substrate support 106, the substrate 108 or combinations thereof. A portion of the radiant energy 204 which is reflected from the substrate support 106 can then be received by the back pyrometer 154. Simultaneously, the substrate support 108 can radiate thermal radiation 206, some of which is received by the back pyrometer 154. The portion of radiant energy 204 which is in the detected wavelength (referred to herein as "lamp noise") as well as the thermal radiation 206 are detected by the back pyrometer 154 and used to calculate the temperature of the substrate 108.

The true temperature of the substrate 108 is determined by the thermal radiation 206. As the lamp noise received by the back pyrometer 154 is not related to the temperature of the substrate, any signal received in the absence of heating the chamber is believed to be related to lamp noise alone. Therefore, embodiments described herein differentiate between lamp noise by performing short, non-heating cycles. The detected signal can be used to determine both the steady state value and first order time-response model of the noise.

Figure 3A:
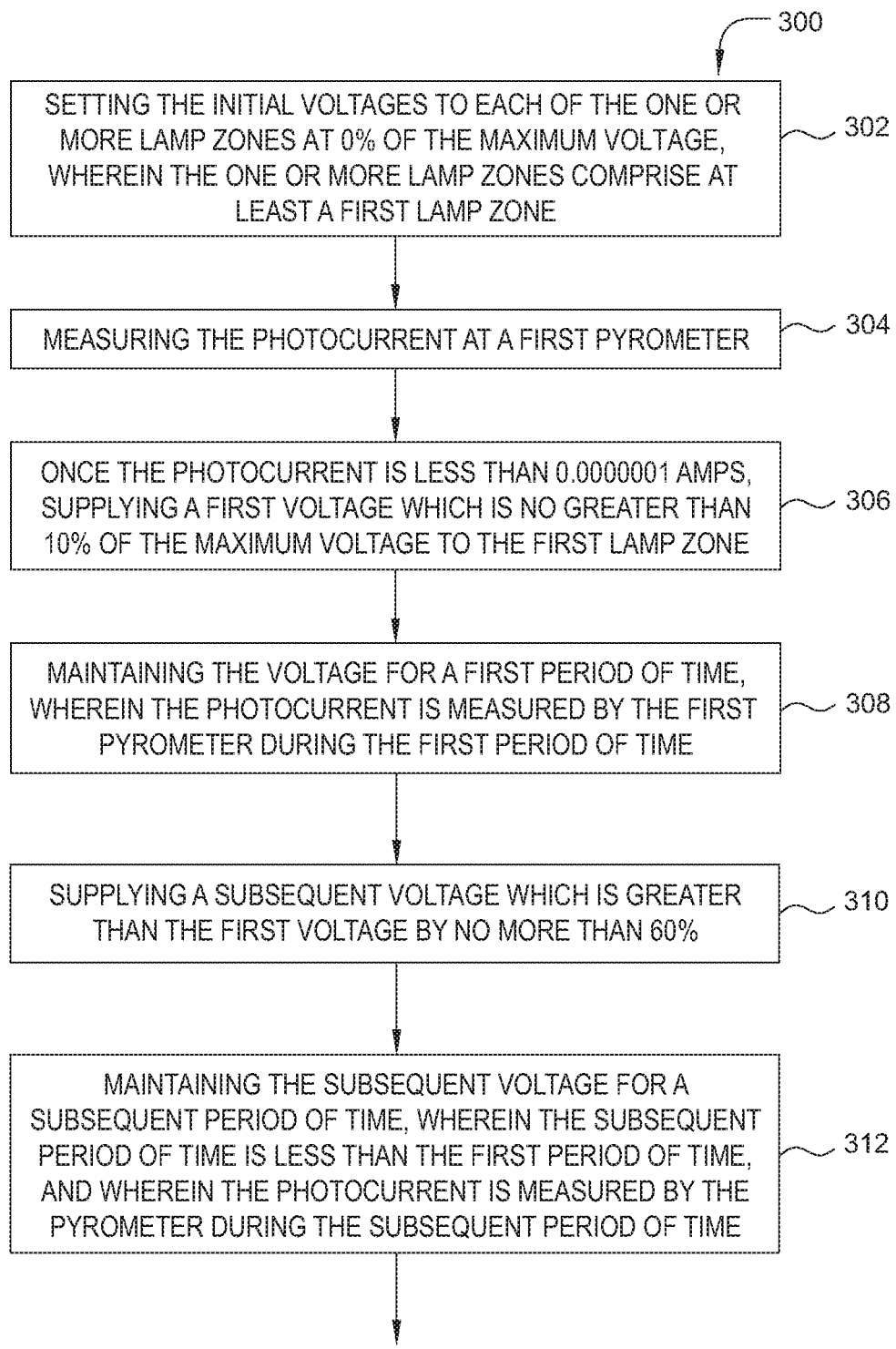
FIGS. 3A and 3B are a flow diagram of a method for measuring lamp noise according to one embodiment.
Figure 3B:
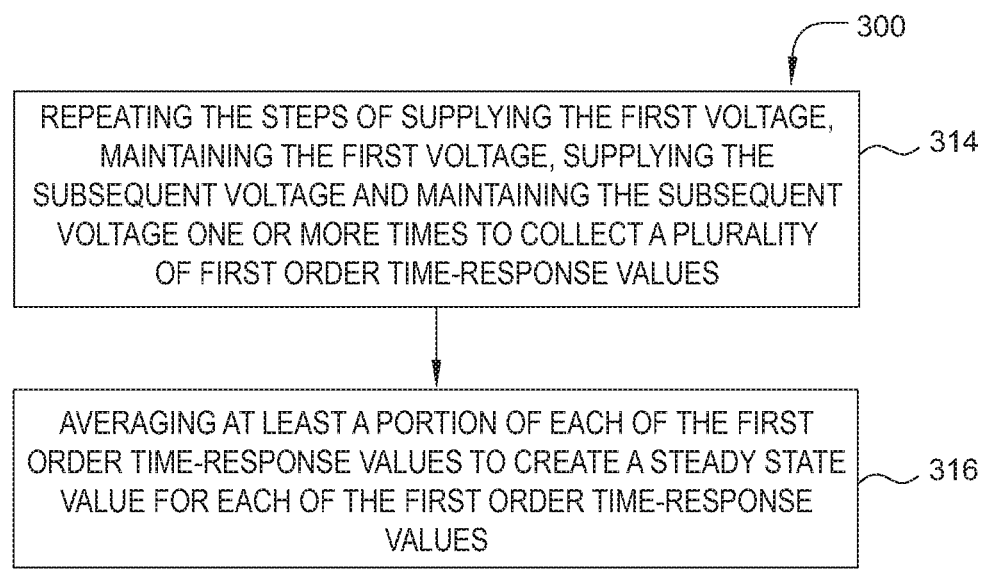

FIGS. 3A and 3B are a flow diagram of a method 300 for measuring lamp noise according to one embodiment. The method 300 begins at step 302 with the initial voltages to each of the one or more lamp zones being set to 0% of the maximum voltage. As described with reference to FIGS. 1 and 2, the process chamber can have one or more lamp zones. The one or more lamp zones comprise at least a first lamp zone. The lamp zones can comprise a plurality of lamps. The lamps can be divided approximately equally among the zones. In one embodiment, the process chamber has a total of 400 lamps in the lamphead with six lamp zones of approximately 66 lamps per zone.

The photocurrent is then measured at a first pyrometer, as in step 304. The photocurrent received by the pyrometer can vary based on whether the process chamber has been recently heated. The photocurrent measured at this point for a process chamber should include only radiance based on the ambient temperature from the environment. The photocurrent at this temperature is equal to the dark current offset of the pyrometer. A substrate can be present in the chamber during the steps of method 300. It is understood that the first pyrometer can be either a back pyrometer or a front pyrometer, as described with reference to FIG. 1.

The first voltage is supplied once the photocurrent is less than the dark current offset of the pyrometer. The dark current offset of the pyrometer is the detectable current by the pyrometer at ambient temperatures. In one embodiment, the dark current offset for a long-wave 3.3 um pyrometer is less than $1*10^{-7}$ Amps. However, dark current offset may vary with different pyrometers.

Once the detected photocurrent is less than the dark current offset of the pyrometer, a first voltage which is no greater than 10% of the maximum voltage can be supplied to the first lamp zone, as in step 306. The voltage is applied to the lamps through an electrical connection, such as the PCB described with reference to FIG. 1. The voltage can be less than or equal to 5% of the maximum voltage in some embodiments. In one embodiment, the voltage supplied to the first lamp zone is 5% of the maximum voltage. Once a voltage is applied, the lamps will deliver radiant energy to the chamber, which can be absorbed by the chamber components or the substrate.

The first voltage can then be maintained for a first period of time, as in step 308. The first voltage causes the lamps to produce radiant energy which will be absorbed by components in the chamber and lamp noise which will be received by the first pyrometer. Thermal radiation from the chamber and lamp noise from the lamps produce a photocurrent at the first pyrometer. The photocurrent is then measured by the first pyrometer during the first period of time. The first period of time is a short period which does not significantly heat up the chamber. The first period of time can be between 120 and 250 seconds, such as from 150 and 180 seconds. In one embodiment, the first time period is 180 seconds. The photocurrent can reach an approximate peak level during the first period of time which sets a base line for further noise measurement.

Without intending to be bound by theory, it is believed that maintaining a low voltage at the lamps prevents variability in noise measurement. The lamps are not believed to provide a constant signal from a cold state (when the lamps are at equilibrium with the environment). When detecting very small photocurrent changes, such as those produced by lamp noise, small differences between the lamps, the connections, or other components can create variability in the initial behavior of the lamps in each lamp zone. This variability is believed to be muted once the lamps have been minimally active for a short period of time. Thus, by applying a small voltage to the lamps, the early variability in measured photocurrent during heat up can be avoided.

A subsequent voltage which can be greater than the first voltage, such as by no more than 60%, can then be supplied, as in step 310. The subsequent voltage can be any voltage between the first voltage and about 70%, such as from about 1% to about 60%, from about 2% to about 60%, from about 3% to about 60%, from about 4% to about 60%, from about 5% to about 60%, from about 6% to about 60%, from about 7% to about 60%, from about 8% to about 60%, from about 9% to about 60%, and from about 10% to about 60%. In another embodiment, the subsequent voltage can be any voltage between the first voltage and about 50%. In one embodiment, the first voltage is about 5% and the subsequent voltage is about 15%. In another embodiment, the first voltage is about 5% and the subsequent voltage is about 25%. In another embodiment, the first voltage is about 5% and the subsequent voltage is about 35%. In another embodiment, the first voltage is about 5% and the subsequent voltage is about 45%.

The subsequent voltage can then be maintained at the first lamp zone for a subsequent period of time, as in step 312. The subsequent period of time is less than the first period of time. The subsequent period of time is a period of time which is not expected to significantly raise the temperature of the chamber. The subsequent period of time can be a relatively short period of time, such as no more than 10% of the first period of time, such as from about 3 seconds to about 15 seconds, for example from about 3 seconds to about 10 seconds. In one embodiment, the subsequent period of time is about 5 seconds. The photocurrent is measured by the pyrometer during the subsequent period of time. The photocurrent can be measured in a variety of ways, such as by continuous measurement during the subsequent period of time. The measurement during the subsequent period of time produces a first order response such that the initial lamp noise increases more dramatically at early time points and levels off at later time points.

Without intending to be bound by theory, it is believed to be beneficial to measure the lamp zones individually. The lamp noise detected at the pyrometer, such as the first pyrometer, is increased based on the proximity of the lamp zone to the optical connection for the pyrometer, such as the ports 109 described with reference to FIG. 1. Stated another way, the closer the lamp zone is to the optical connection for the pyrometer, the more lamp noise is received by the pyrometer. Further, during operation, the one lamp zone of the process chamber may be activated (receiving voltage) while another lamp zone is not receiving voltage. Therefore, it is believed to be helpful to determine the lamp noise for each zone at each pyrometer, such that it can be removed when the lamp zone is activated.

The steps of supplying the first voltage (step 306), maintaining the first voltage (step 308), supplying the subsequent voltage (step 310) and maintaining the subsequent voltage (step 312) can be repeated one or more times to collect a plurality of first order response values, as in step 314. The steps described above can be repeated to create a range of measurements based on the subsequent voltage. In one embodiment, the steps are repeated five times to produce measurements for 5%, 15%, 25%, 35% and 45% of the maximum voltage at the first lamp zone. In this embodiment, five groups of first order response values are collected at the first lamp zone.

Averaging at least a portion of each of the first order time response values to create a steady state value for each of the first order time response values, as in step 316. First order response values will "level off", or reduce the rate of increase compared to the preceding value, later in the subsequent period of time. For example, in an embodiment where voltage is delivered over a period of 5 seconds, the rate of increase for the lamp noise values detected at the first pyrometer will be less at 4.5 seconds than lamp noise values detected at the first pyrometer at 1 second. As such, a steady state value can be approximated by averaging a portion of the first order time response values which correspond to later time points, such as the first order time response values which correspond to the time between 4.5 second and 5 seconds as measured at the first pyrometer. The average can be the steady state value. In further embodiments, different corresponding time ranges can be used, specific points in time can be averaged (such as the average of the value at 4.75 seconds and the value at 5 seconds) or a single point may be used as an approximate (such as the value at 5 seconds).

Without being bound by theory, the transition between voltages produce noise that is not properly incorporated by the first order time response alone. The lamp noise produced is proportional to the voltage applied. Thus the first order time response values based on the lamp noise detected at a pyrometer for a specific voltage can provide a good approximation of the lamp noise during operation. However, changing voltages can momentarily change the lamp noise with relation to the new voltage. Thus, by calculating and subtracting the steady state value for the original voltage at the transition point Though the embodiments described herein discuss the measurement of lamp noise at a single pyrometer as received from the lamp zones, it is understood that multiple pyrometers can be used to measure the lamp noise at the same time. In one embodiment, two pyrometers are used to measure the lamp noise received from each of the lamp zones.

Figure 4:
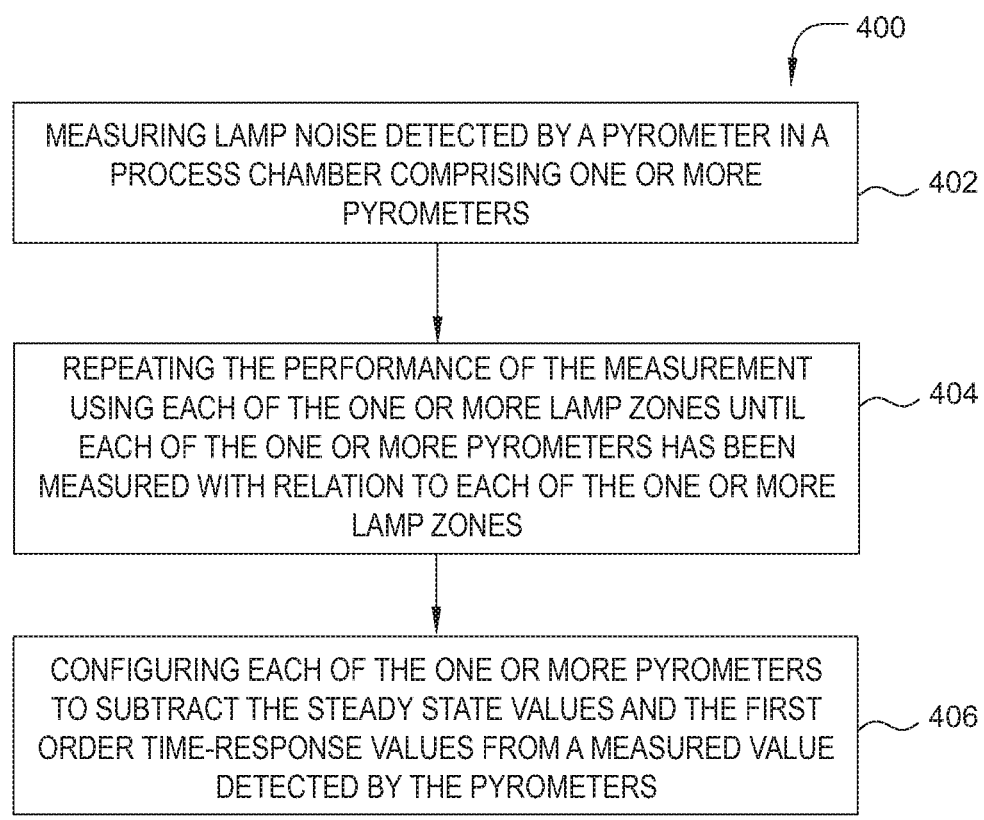
FIG. 4 is a flow diagram of a method for noise correction according to one embodiment.

FIG. 4 is a flow diagram of a method 400 for noise correction according to one embodiment. The method 400 begins at step 402 with lamp noise detected by a pyrometer in a process chamber comprising one or more pyrometers being measured as described above with reference to FIG. 3.

Next, the performance of the measurement can be repeated using each of the one or more lamp zones and at each of the one or more pyrometers until each of the one or more pyrometers has been measured with relation to each of the one or more lamp zones, as in step 404. Voltage at varying levels, as described with reference to FIG. 3, can be delivered to each of the lamp zones. Noise from each of the lamp zones can be measured at each of the pyrometers.

After the measurements are complete, the linear relation between the steady state values can be calculated for each of the one or more lamp zones and each of the one or more pyrometers, as in step 406. At this point, the steady state measured values from the can be used to produce a line graph. The line graph can be used to calculate the intervening steady state values based on the measured values.

Then the steady state values and the first-order time response values can be subtracted from a measured value detected by the pyrometers to create an adjusted value, as in step 408. Once the steady state values have been determined, the steady state values and the first-order time response values are subtracted from a measured value. The measured value can be defined as photocurrent value measured at the pyrometer to determine the temperature of the substrate.

The background subtraction algorithm involves estimating lamp noise for each pyrometer based on the real-time instantaneous zone voltages and subtracting the lamp noise estimate from the total measured pyrometer signal to obtain estimated thermal photocurrent due to measured, real temperature from the substrate.

To remove the lamp noise the following formula can be applied:

$$I = I_t + I_n$$

wherein I=total measured pyrometer photocurrent, such as the photocurrent measured by the pyrometer during the measurement of a heated substrate, $I_t$=photocurrent thermal signal from real temperature (the thermal radiance described with reference to FIG. 2) and $I_n$=photocurrent due to lamp/background noise (the lamp noise detected at the pyrometer from all lamp zones)

To calculate the estimated portion of the photocurrent which is related to the thermal radiation alone, the formula can be rewritten as follows:

$$I_{t(est)} = I - I_n$$

As described above, the lamp noise is a combination of all noise from the lamp zones detected at all pyrometers. Thus, the noise estimate for a pyrometer, pi, at any given sample time, t, with lamp zone voltage level (z1, z2, z3, z4, z5, and z6) can be computed as a linear additive composition of the independent zone levels using the following formula:

$$I_n(pi,t)(z1,z2,z3,z4,z5,z6) = I_n(pi,z1,t) + I_n(pi,z2,t) + I_n(pi,z3,t) + I_n(pi,z4,t) + I_n(pi,z5,t) + I_n(pi,z6,t)$$

Various methods can be used to subtract the lamp noise estimates from the measured value at the pyrometer. In the Steady-State Noise Subtraction method, the estimated background noise for subtraction is the steady-state noise levels at a given lamp zone power level. These can be subtracted using the following formula:

$$I_n(pi,t)(z1,z2,z3,z4,z5,z6) = [I_n(pi,z1) + I_n(pi,z2) + I_n(pi,z3) + I_n(pi,z4) + I_n(pi,z5) + I_n(pi,z6)][ss]$$

wherein $I_n(pi,zi)$ is the lamp noise ($I_n$) at a specific pyrometer (zi) based on a specific zone (zi) can be estimated per as described above either using piece-wise linear interpolation or using a 3rd order polynomial fit.

In the real-time Model-Based Noise Subtraction method, the estimated background noise for subtraction is the estimated real-time noise levels at a given lamp zone power level. Since the noise response is an exponential first-order time-response of the lamp-filament heat-up response, this is captured in the formula below:

$$\text{Voltage in}(V_{in}) - \text{voltage out}(V_{out}) = \text{resistance}(R) * \text{current}(C) * dV_{out}/dt$$

The phrase real-time reflects the determination of noise during operation. In one embodiment, the real-time noise subtraction is done at a specific frequency over a period of time during the operation of the chamber, such as during substrate processing. Frequency can relate to the periodicity of the measurements of the noise, the periodicity of the measurements of the temperature during processing or combinations thereof.

Since the photocurrent noise is proportional to the voltage applied, the photocurrent noise can be directly modeled using a first-order time response and the time constant can be computed empirically, as depicted by the following formula:

$$I_n(pi,t)/Z(t) = [K/(1+\tau s)]$$

wherein $I_n(pi,t)$ is the photocurrent noise ($I_n$) of pyrometer, pi, detected at time, t, Z(t) is the real-time voltage applied to all lamps, K is the gain, τ is the lamp time-constant and s is the Laplace transform variable. Since Z(t) is the same as the real time voltage applied to all lamps at steady state, Z(ss), values, the formula can be re-arranged as follows:

$$I_n(pi,t)/I_n(pi)(ss) = 1/(1+\tau s)$$

wherein $I_n(pi)(ss)$ is the steady-state photocurrent noise of pyrometer, pi, as determined in based on the method of FIG. 3. Expanding the Laplace transform variable and writing the discrete-time implementation of the above, the formula can be further rearranged and reduced as follows:

$$I_n(pi,t) + \tau(d \ln(pi,t)/dt) = I_n(pi)(ss)$$

$$I_n(pi,n) = I_n(pi,n-1) + \Delta T/\tau(I_n(pi)(ss) - I_n(pi,n-1))$$

In the converted formula, n is the current sample time, n−1 is the previous sample time and ΔT is the sampling rate.

The above formula can be applied to determine the approximate lamp noise component for a measured photocurrent value at a pyrometer and at a specific time point. For the final software implementation, the following algorithm can be used:

$$I_n(pi,n) = \alpha I_n(pi)(ss) + (1-\alpha) I_n(pi, n-1)$$

wherein $\alpha = \Delta T/\tau$, with $\tau$ being the time-constant. The time constant can be a user-defined attribute. ΔT is the set sampling rate measured in seconds. The sampling rate for the correction algorithm should be the same as the sampling rate of the pyrometer being corrected for.

In the above formula, the steady state value for the lamp noise at a particular voltage as detected by a pyrometer, pi, is multiplied by the value of $\alpha$ which is the time constant divided by the sampling rate. The multiplied value is then added to the adjusted previous noise value, which is the previous value, $I_n(pi, n-1)$, multiplied by $1-\alpha$. In short, the current noise value at a particular voltage is a function of the previous lamp noise value and the steady state lamp noise value. The formula above approximates the first order As with either method of determining $I_n$, the background subtracted signal or the estimated true temperature signal can be computed using the following formula:

$$I_t(pi,n) = I(pi,n) - I_n(pi,n)$$

wherein I(pi,n) is the detected photocurrent value at a specific pyrometer, $I_n(pi,n)$ is the calculated approximate lamp noise and $I_t(pi,n)$ is the approximate thermal radiance component of the detected photocurrent value, also described herein as the adjusted value.

Finally, an actual temperature can be determined based on the adjusted value, as in step 410. Once the adjusted values have been determined, the actual temperature of the substrate at each time point can be determined. This embodiment is described with reference to a long-wave 3.3 um pyrometer. However, the pyrometer described here is not intended to be limiting and a variety of pyrometers can be used with one or more embodiments.

The long-wave 3.3 um Pyrometer described herein has a serial output which streams the total measured photocurrent and the calculated temperature. The output photocurrent reading is the total measured photocurrent (I(pi)) by the pyrometer used for the noise-background subtraction. The look-up photocurrent is calculated using $I_t$ and factored for emissivity and pyrometer calibration coefficients.

Tables 1-4 depict photocurrents detected at pyrometers 1-4. The photocurrents are separated by both the lamp zone where the voltage was delivered and the voltage delivered, described as a percentage of the maximum voltage for each lamp zone. The data is depicted in the tables below:

TABLE 1

Pyrometer 1 - Photocurrent

| V % | Zone 1 | Zone 2 | Zone 3 | Zone 4 | Zone 5 | Zone 6 |
|---|---|---|---|---|---|---|
| 5 | 4.31E−08 | 5.01E−08 | 4.75E−08 | 3.50E−08 | 2.72E−08 | 2.18E−08 |
| 15 | 2.77E−07 | 3.19E−07 | 2.85E−07 | 1.88E−07 | 1.26E−07 | 9.56E−08 |
| 25 | 5.57E−07 | 6.53E−07 | 5.65E−07 | 3.66E−07 | 2.43E−07 | 1.80E−07 |
| 35 | 8.17E−07 | 9.46E−07 | 8.20E−07 | 5.34E−07 | 3.53E−07 | 2.61E−07 |
| 45 | 1.02E−06 | 1.17E−06 | 1.01E−06 | 6.55E−07 | 4.36E−07 | 3.21E−07 |

TABLE 2

Pyrometer 2 - Photocurrent

| V % | Zone 1 | Zone 2 | Zone 3 | Zone 4 | Zone 5 | Zone 6 |
|---|---|---|---|---|---|---|
| 5 | 2.93E−08 | 3.55E−08 | 4.80E−08 | 4.71E−08 | 4.08E−08 | 3.09E−08 |
| 15 | 1.61E−07 | 2.21E−07 | 3.06E−07 | 2.92E−07 | 2.31E−07 | 1.56E−07 |
| 25 | 3.18E−07 | 4.56E−07 | 6.16E−07 | 5.82E−07 | 4.47E−07 | 3.00E−07 |
| 35 | 4.63E−07 | 6.63E−07 | 8.95E−07 | 8.50E−07 | 6.56E−07 | 4.38E−07 |
| 45 | 5.78E−07 | 8.20E−07 | 1.10E−06 | 1.05E−06 | 8.05E−07 | 5.42E−07 |

TABLE 3

Pyrometer 3 - Photocurrent

| V % | Zone 1 | Zone 2 | Zone 3 | Zone 4 | Zone 5 | Zone 6 |
|---|---|---|---|---|---|---|
| 5 | 1.17E−08 | 1.79E−08 | 3.19E−08 | 3.65E−08 | 4.73E−08 | 3.62E−08 |
| 15 | 7.58E−08 | 1.26E−07 | 2.22E−07 | 2.65E−07 | 3.29E−07 | 2.32E−07 |
| 25 | 1.50E−07 | 2.63E−07 | 4.52E−07 | 5.39E−07 | 6.48E−07 | 4.61E−07 |
| 35 | 2.19E−07 | 3.84E−07 | 6.61E−07 | 7.97E−07 | 9.59E−07 | 6.75E−07 |
| 45 | 2.73E−07 | 4.75E−07 | 8.17E−07 | 9.90E−07 | 1.17E−06 | 8.31E−07 |

TABLE 4

| | Pyrometer 4 - Photocurrent | | | | | |
|---|---|---|---|---|---|---|
| V % | Zone 1 | Zone 2 | Zone 3 | Zone 4 | Zone 5 | Zone 6 |
| 5 | 3.47E−08 | 3.84E−08 | 5.20E−08 | 6.08E−08 | 6.89E−08 | 8.03E−08 |
| 15 | 6.47E−08 | 9.44E−08 | 2.00E−07 | 2.73E−07 | 3.30E−07 | 3.93E−07 |
| 25 | 1.01E−07 | 1.64E−07 | 3.77E−07 | 5.29E−07 | 6.32E−07 | 7.61E−07 |
| 35 | 1.35E−07 | 2.27E−07 | 5.39E−07 | 7.63E−07 | 9.14E−07 | 1.10E−06 |
| 45 | 1.61E−07 | 2.74E−07 | 6.67E−07 | 9.32E−07 | 1.13E−06 | 1.34E−06 |

Figure 5:
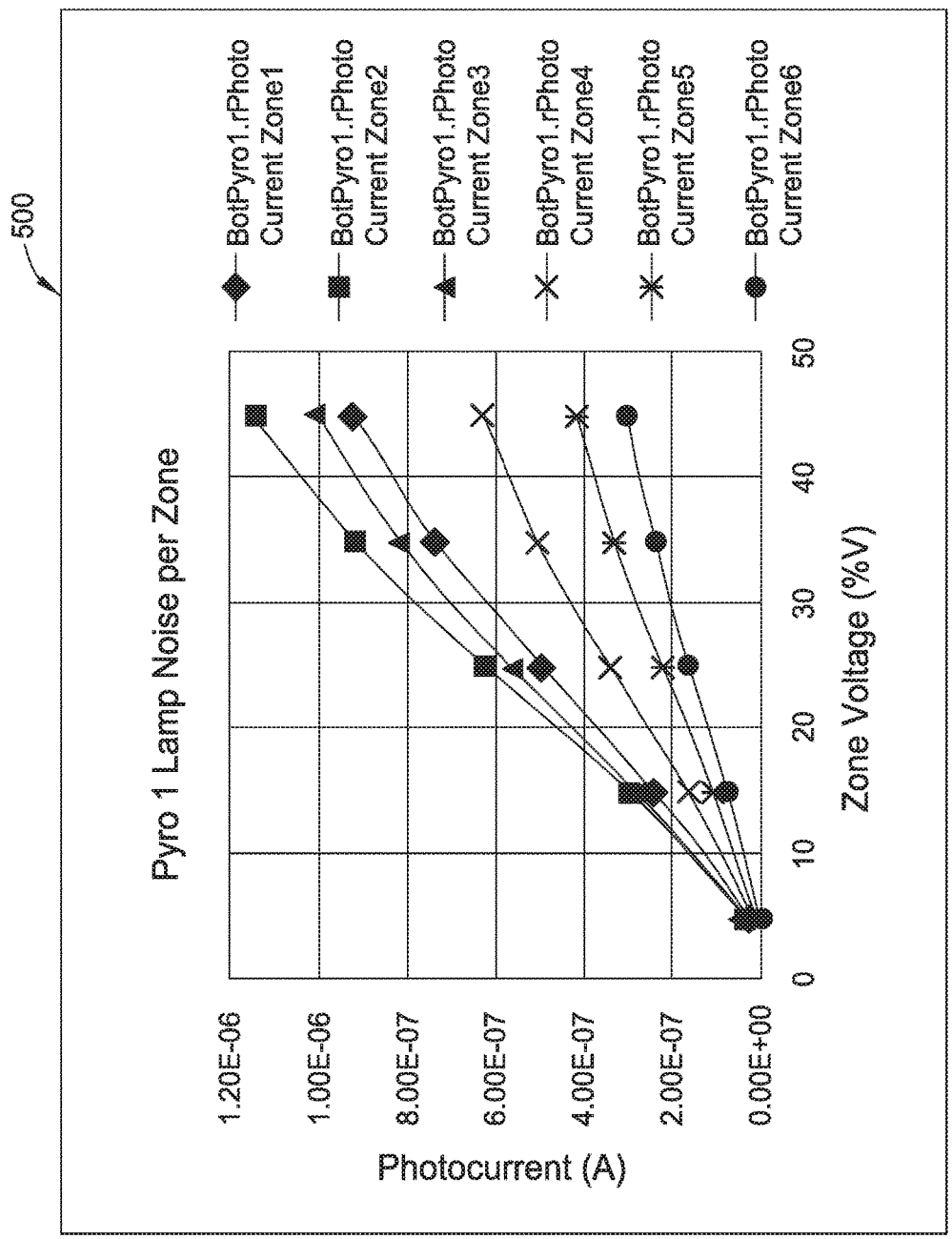
FIG. 5 is graph depicting the detection of the first order transient response at a pyrometer according to one embodiment.

FIG. 5 is a depiction of a line graph 500 for the measured steady state values, according to one embodiment. In this embodiment, a thermal processing chamber was equipped with four pyrometers and a total of six lamp zones. The photocurrent (measured in Amps) was detected as described above using voltages of 5%, 15%, 25%, 35% and 45% of the maximum voltage at each of the six zones. The data disclosed in table 1 was converted to a line graph and a best fit line was fit to the graphical data. The best fit line or the numerical representation thereof can then be used to extrapolate the approximate photocurrent for lamp noise at a specific voltage.

Though only the first pyrometer is graphically represented here, it is understood that the measured photocurrents from all pyrometers can be used to extrapolate the linear relation between the measured values.

Figure 6:
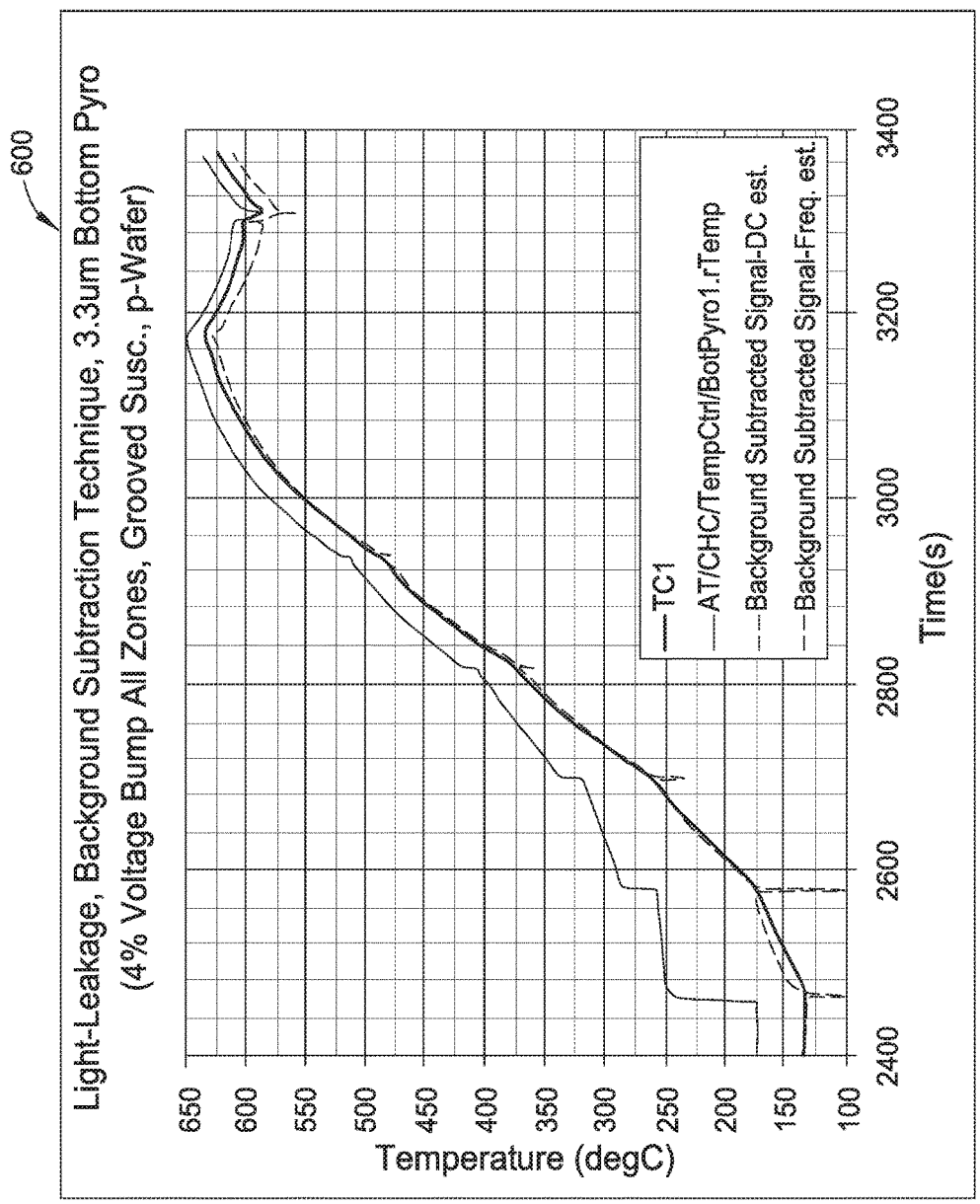
FIG. 6 is a graph depicting the steady state value at a pyrometer according to one embodiment.

FIG. 6 depicts a line graph 600 showing the pyrometer signal adjusted using the background subtraction technique according to one embodiment. The graph 600 shows the measured photocurrent output, the actual temperature of the substrate as measured by a thermocouple, the DC background subtracted output and the frequency background subtracted output. and the frequency background subtracted output correlates to the Real-time Model-Based Noise Subtraction method.

The measured photocurrent output line is the temperature based on the detected photocurrent output at the first pyrometer with heating from all lamp zones. As shown by comparison to the thermocouple, the temperature measured by the first pyrometer fails to correlate with the thermocouple temperature. The DC background subtracted signal (DC signal) correlates to the measured photocurrent output as adjusted using the Steady-State Noise Subtraction method, with the adjusted photocurrent value translated to the temperature in degrees Celsius. The DC signal shows much better correlation to the thermocouple, with the exception of overcompensation at the voltage transition points (shown by spikes in the DC signal). The frequency background subtracted signal (Freq. signal) correlates to the measured photocurrent output as adjusted using the Real-time Model-Based Noise Subtraction method, with the adjusted photocurrent value translated to the temperature in degrees Celsius. The Freq. signal shows much better correlation to the thermocouple than either of the previous lines with comparatively less overcompensation.

While the foregoing is directed to embodiments of the invention, other and further embodiments of the invention may be devised without departing from the basic scope thereof.

The invention claimed is:

1. A system comprising:
a processing chamber configured to process a substrate;
a substrate support disposed in the processing chamber;
a pyrometer positioned to receive radiation emitted by the substrate or a component of the processing chamber and generate a pyrometer signal indicative of the received radiation; and
a controller configured to subtract a time invariant noise component and a time variant noise component from the pyrometer signal during processing of the substrate.

2. The system of claim 1, wherein the controller determines an approximate lamp noise component for a measured photocurrent value at the pyrometer and at a specific time point.

3. The system of claim 1, wherein the system is configured to determine the time invariant noise component and the time variant noise component using a plurality of first order response values as measured at one or more lamp zones in the processing chamber.

4. The system of claim 3, wherein the plurality of first order response values are measured at 5%, 15%, 25%, 35% and 45% of a maximum voltage at each of the one or more lamp zones.

5. A system, comprising:
a processing chamber configured to process a substrate;
a substrate support disposed in the processing chamber;
one or more pyrometers positioned to receive radiation emitted by the substrate or a component of the processing chamber and generate a pyrometer signal indicative of the received radiation; and
a controller that determines an amount of noise generated by a lamp of the processing chamber, the controller performing an operation of:
averaging at least a portion of a plurality of first order time-response values generated by the one or more pyrometers to create a steady state value for each of the first order time response values.

6. The system of claim 5, wherein averaging at least a portion of the plurality of first order time-response values to create a steady state value for each of the first order time response values, comprises:
measuring a first photocurrent at a first pyrometer of the one or more pyrometers;
supplying a first voltage to a first lamp zone of one or more lamp zones;
maintaining the first voltage for a first period of time, wherein a second photocurrent is measured by the first pyrometer during the first period of time;
supplying a second voltage which is greater than the first voltage to the first lamp zone;
maintaining the second voltage for a second period of time, wherein the second period of time is less than the first period of time, and wherein a third photocurrent is measured by the first pyrometer during the second period of time; and
repeating the supplying the first voltage, the maintaining the first voltage, the supplying the second voltage and the maintaining the second voltage one or more times to collect the plurality of first order time-response values.

7. The system of claim 6, wherein the first voltage is no greater than 10% of a maximum voltage.

8. The system of claim 6, wherein the second voltage is no greater than 70% of a maximum voltage.

9. The system of claim 6, further comprising:
determining the steady state value for each pyrometer and corresponding lamp zone;
determining a voltage dependent noise value for each pyrometer and corresponding lamp zone; and
subtracting the steady state value and the voltage dependent noise values from the pyrometer readings to determine temperature.

10. The system of claim 6, further comprising setting an initial voltage to each of the one or more lamp zones at 0% of a maximum voltage.

11. The system of claim 6, wherein the first photocurrent is equal to a dark current offset of the first pyrometer.

12. The system of claim 6, wherein the first period of time is between about 120 and about 250 seconds.

13. The system of claim 6, wherein the second voltage is between the first voltage and about 60% of maximum power.

14. The system of claim 6, wherein the first pyrometer is a back pyrometer.

15. The system of claim 6, wherein each of the lamp zones are measured individually.

16. The system of claim 6, further comprising:
repeating the lamp noise measuring using each of the one or more lamp zones and at each of the one or more pyrometers until each of the one or more pyrometers has measured with relation to each of the one or more lamp zones;
calculating a linear relation between the steady state values for each of the one or more lamp zones and each of the one or more pyrometers;
subtracting the steady state values and the first order time-response values from a measured value detected by the one or more pyrometers to create an adjusted value; and
determining an actual temperature based on the adjusted value.

17. The system of claim 16, further comprising setting an initial voltage to each of the one or more lamp zones at 0% of a maximum voltage.

18. A system, comprising:
a processing chamber configured to process a substrate;
a substrate support disposed in the processing chamber;
one or more pyrometers, each pyrometer positioned to receive radiation emitted by the substrate or a component of the processing chamber and generating a pyrometer signal indicative of the received radiation; and
a controller that determines an amount of noise generated by a lamp of the processing chamber, the controller performing the operation of:
measuring lamp noise detected by a pyrometer in the processing chamber at a temperature near ambient temperature, the process chamber comprising one or more pyrometers and one or more lamp zones;
repeating the performance of the measurement using each of the one or more lamp zones and at each of the one or more pyrometers until each of the one or more pyrometers has measured with relation to each of the one or more lamp zones, the lamp zones being measured individually;
calculating a linear relation between steady state values for each of the one or more lamp zones and each of the one or more pyrometers;
subtracting the steady state values and first order time-response values from a measured value detected by the one or more pyrometers to create an adjusted value; and
determining an actual temperature based on the adjusted value.

19. The system of claim 18, wherein the measuring lamp noise comprises:
setting an initial voltage to each of the one or more lamp zones at 0% of a maximum voltage;
measuring a first photocurrent at a first pyrometer of the one or more pyrometers;
once the first photocurrent is less than a dark current offset for the pyrometer, supplying a first voltage which is no greater than 10% of the maximum voltage to a first lamp zone of the one or more lamp zones;
maintaining the first voltage for a first time period of between 120 and 250 seconds, wherein a second photocurrent is measured by the first pyrometer during the first time period;
supplying a second voltage which is greater than the first voltage by no more than 60% of the first voltage;
maintaining the second voltage for a second time period of from about 3 seconds to about 15 seconds, and wherein a third photocurrent is measured by the first pyrometer during the second time period;
repeating the supplying the first voltage, the maintaining the first voltage, the supplying the second voltage and the maintaining the second voltage one or more times to collect a plurality of first order time-response values, the plurality of first order time-response values including measurements where the second voltage is at least at 5%, 15%, 25%, 35% and 45% of the maximum voltage; and
averaging at least a portion of the first order time response values to create a steady state value for each of the first order time response values.

20. The system of claim 19, wherein the dark current offset for the first pyrometer is less than $1 \times 10^{-7}$ Amps.

21. The system of claim 19, wherein the first voltage is no more than 5% of the maximum voltage.

22. The system of claim 19, wherein the first voltage is maintained for a first time period of between 150 and 180 seconds.

23. The system of claim 19, wherein the second voltage is no more than about 50% of the first voltage.

24. The system of claim 19, wherein the second voltage is maintained for a second time period no more than 10% of the first time period.

* * * * *